United States Patent
Lee et al.

(10) Patent No.: US 6,818,467 B2
(45) Date of Patent: Nov. 16, 2004

(54) P-TYPE OHMIC ELECTRODE IN GALLIUM NITRIDE BASED OPTICAL DEVICE AND FABRICATION METHOD THEREOF

(75) Inventors: Jong Lam Lee, Pohang (KR); Soo Young Kim, Seoul (KR); Ho Won Jang, Euiseong-gun (KR)

(73) Assignee: Pohang University of Science and Technology Foundation, Pohang (KR)

( * ) Notice: Subject to any disclaimer, the term of this patent is extended or adjusted under 35 U.S.C. 154(b) by 0 days.

(21) Appl. No.: 10/394,045

(22) Filed: Mar. 24, 2003

(65) Prior Publication Data

US 2003/0190764 A1 Oct. 9, 2003

(30) Foreign Application Priority Data

Mar. 25, 2002 (KR) ................. 10-2002-0016090

(51) Int. Cl.[7] .......................... H01L 29/40; H01L 29/20
(52) U.S. Cl. ........................................ 438/46; 257/615
(58) Field of Search ........................ 438/604, 764, 438/694, 606, 602, 46, 3, 5, 697; 257/485, 103, 99, 96, 77, 15, 615

(56) References Cited

U.S. PATENT DOCUMENTS 6,180,963 B1 * 1/2001 Arai ........................... 257/103
6,287,947 B1 * 9/2001 Ludowise et al. ........... 438/606
6,573,117 B2 * 6/2003 Uemura et al. ............... 438/46
6,693,352 B1 * 2/2004 Huang et al. ................ 257/743

FOREIGN PATENT DOCUMENTS

KR 10-012921 1/1998
KR 2000-012899 1/2000

* cited by examiner

Primary Examiner—David A. Zarneke
Assistant Examiner—Monica D. Harrison
(74) Attorney, Agent, or Firm—Rothwell, Figg, Ernst & Manbeck, P.C.

(57) ABSTRACT

A gallium nitride (GaN) based optical device and a fabrication method thereof are provided. The GaN based optical device includes a substrate, a p-type GaN (p-GaN) layer formed on the substrate, and a p-type ohmic electrode formed on the p-GaN layer, wherein the p-type ohmic electrode is formed of a triple layer comprised of a nickel (Ni) layer, a gold (Au) layer and an indium tin oxide (ITO) layer sequentially formed. The thicknesses of the Ni layer and the Au layer forming the triple layer are smaller than the thickness of the ITO layer. When the p-type ohmic electrode in the GaN based optical device is formed of a triple layer comprised of Ni/Au/ITO, the Ni/Au layers reduce contact resistance and the ITO, which is a transparent, conductive oxide layer, increases transparency and increases luminescence efficiency.

5 Claims, 6 Drawing Sheets

P-TYPE OHMIC ELECTRODE IN GALLIUM NITRIDE BASED OPTICAL DEVICE AND FABRICATION METHOD THEREOF

This application claims the priority of Korean Patent Application No. 2002-16090, filed on Mar. 25, 2002, in the Korean Intellectual Property Office, the disclosure of which is incorporated herein in its entirety by reference.

BACKGROUND OF THE INVENTION

1. Field of the Invention

The present invention relates to an ohmic electrode for use in an optical device and a fabrication method thereof, and more particularly, to a p-type ohmic electrode in a gallium nitride based (GaN based) optical device and a fabrication method thereof.

2. Description of the Related Art

Optical devices, e.g., light emitting devices utilizing gallium nitride based compound semiconductors such as GaN, InGaN or AlGaN, effectively emit light with blue light wavelength region and have high light power compared to conventional optical devices. In particular, blue light has a shorter wavelength than red light, it can be easily converted into longer wavelength light. Thus, in recent years, a great deal of attention has been directed to GaN light emitting devices as white-light emitting devices.

In fabricating a GaN light emitting device, an n-type ohmic electrode and a p-type ohmic electrode are formed on an n-type gallium nitride (n-GaN) layer and a p-type gallium nitride (p-GaN) layer, respectively. The n-type and p-type ohmic electrodes must have low contact resistance and must be thermally stable. In particular, the p-type ohmic electrode must be a transparent electrode that can transmit emitted light. However, the p-type ohmic electrode formed on the p-type GaN layer has poor activation efficiency of Mg dopant doped into the p-type GaN layer, so that a hole concentration of $10^{18} cm^{-3}$ or higher cannot be obtained, making it difficult to attain contact resistance as low as approximately $10^{-5} \Omega cm^2$.

However, a p-type ohmic electrode in a general GaN light emitting device lowers contact resistance using a nickel (Ni)/gold (Au) layer formed by stacking an Au layer on an Ni layer. In this case, the contact resistance of the p-type ohmic electrode is as low as approximately $10^{-4} \Omega$, the Ni layer is converted into a transparent NiO layer so as to easily transmit light, and the Au layer increases lateral transmittance of the electrode. The Ni/Au ohmic electrode having the entire thickness of approximately 10 nm has superior transmittance to light in the wavelength region of 300~500 nm, that is, approximately 80%.

However, even if the Ni/Au layer is used in the p-type ohmic electrode, the p-GaN layer itself has high resistance so that current from the p-type ohmic electrode cannot effectively spread into the p-GaN layer. In order to increase a current-spreading effect, the p-type ohmic electrode may be formed in a finger shape, which however results in a reduction of light emission.

Further, when the Ni/Au ohmic electrode is annealed for forming an ohmic contact, internal diffusion of Au may occur, suggesting poor thermal stability, and the lateral profile of the Au layer is not uniform.

SUMMARY OF THE INVENTION

To solve the above-described problems, the present invention provides a p-type ohmic electrode in a gallium nitride (GaN) based optical device having an increased emission efficiency with superior transmittance of light while having low contact resistance.

The present invention also provides a method of fabricating the p-type ohmic electrode in a gallium nitride (GaN) based optical device.

In an aspect of the present invention, there is provided a GaN based optical device including a substrate, a p-GaN layer formed on the substrate, and a p-type ohmic electrode formed on the p-GaN layer, wherein the p-type ohmic electrode is formed of a triple layer comprised of a nickel (Ni) layer, a gold (Au) layer and an indium tin oxide (ITO) layer sequentially formed. Preferably, the thicknesses of the Ni layer and the Au layer are smaller than the thickness of the ITO layer.

In another aspect of the present invention, there is provided a method of fabricating a GaN based optical device including forming a p-GaN layer on a substrate. Then, a metal layer pattern comprised of a nickel (Ni) layer, a gold (Au) layer and an indium tin oxide (ITO) layer sequentially formed is formed on the p-GaN layer. The metal layer pattern is annealed and then a p-type ohmic electrode is formed. The annealing of the metal layer pattern may be performed under an oxygen or nitrogen atmosphere. Also, the annealing of the metal layer pattern may be performed at 400~600° C. In the metal layer pattern, the ITO layer may be formed using an RF magnetron sputtering apparatus while maintaining the temperature of the substrate at room temperature to 400° C.

As described above, if the p-type ohmic electrode in the GaN based optical device with according to the present invention is formed of a triple layer comprised of Ni/Au/ITO, the Ni/Au layers in the triple layer reduces contact resistance and the ITO layer as a transparent, conductive oxide layer, increases transparency, and increases luminescence efficiency.

BRIEF DESCRIPTION OF THE DRAWINGS

The above aspect and advantages of the present invention will become more apparent by describing in detail preferred embodiments thereof with reference to the attached drawings in which.

DETAILED DESCRIPTION OF THE INVENTION

Figure 1A:
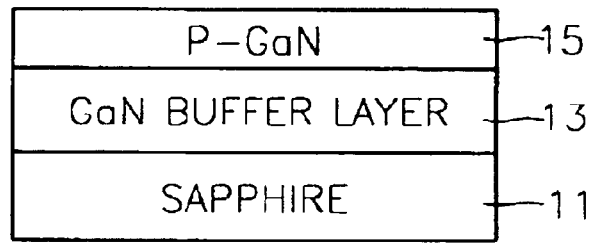
FIGS. 1A through 1E are cross-sectional views of a p-type ohmic electrode in a gallium nitride based (GaN based) optical device according to the present invention and a fabrication method thereof.

Now referring to the drawings, an explanation will be given of embodiments of the present invention. However, the following illustrative embodiments may be modified in various forms and the invention is not limited by the embodiments. These embodiments are provided for explaining the invention more perfectly to one skilled in the art. In the drawings, some dimensions of layers or regions may be exaggerated for the sake of clarity of the description. Also, when it is said that a layer exists "on" another layer or a substrate, the layer may directly exist on another layer or the substrate or a third layer may interposed therebetween.

FIGS. 1A through 1E are cross-sectional views of a p-type ohmic electrode in a gallium nitride based (GaN based) optical device according to the present invention and a fabrication method thereof, in which the p-type ohmic electrode is formed so as to measure ohmic contact resistance rather than being directly formed on the GaN based optical device.

In detail, as shown in FIG. 1A, a GaN buffer layer 13 is on a sapphire substrate 11. Then, a p-GaN layer 15 is formed on the GaN buffer layer 13.

Figure 1B:
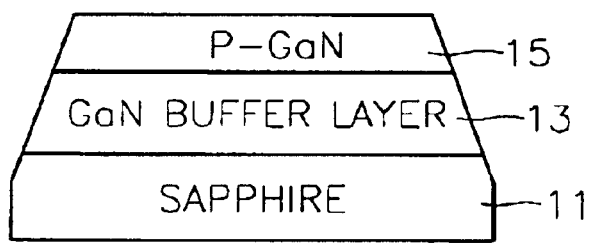

As shown in FIG. 1B, the p-GaN layer 15 and the GaN buffer layer 13 are subjected to mesa etch for device isolation. The mesa etch is performed using inductively coupled plasma apparatus.

Then, the mesa-etched p-GaN 15 is then surface-treated. The surface-treating of the p-GaN layer 15 is performed by dipping the substrate having the p-GaN layer 15 into a boiling solution containing HCl and deionized water ($H_2O$) mixed in 3:1, washing the resultant product with deionized water, and drying with nitrogen. Then, the substrate having the p-GaN layer 15 is dipped into a solution containing HCl and deionized water mixed in the same amount for 1 minute for pre-treatment.

Figure 1C:
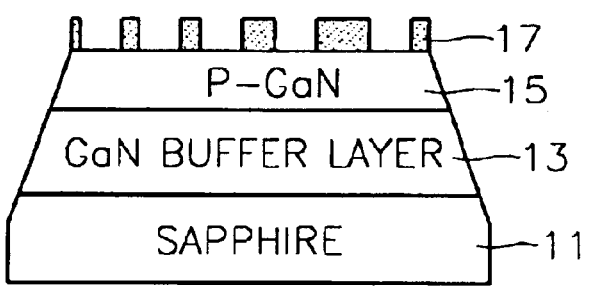

As shown in FIG. 1C, a photoresist pattern 17 is formed on the p-GaN layer 15. The photoresist pattern 17 is formed by general photolithography.

Figure 1D:
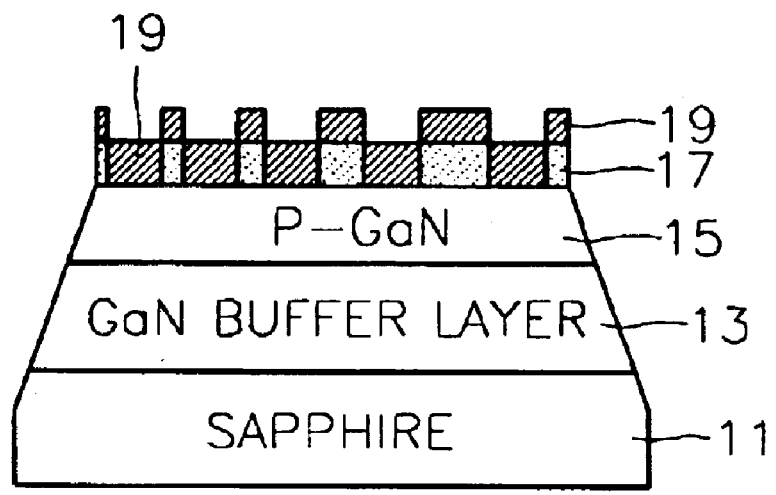

As shown in FIG. 1D, a metal layer 19 is formed over the entire surface of the substrate 11 having the photoresist pattern 17 and the p-GaN layer 15. The metal layer 19 is formed of a triple layer comprised of Ni/Au/ITO. That is, the meal layer 19 is formed by sequentially stacking an Ni layer, an Au layer and an ITO layer.

In the metal layer 19, the Ni and Au layers are formed using an e-beam evaporator, and the ITO layer is formed using an RF magnetron sputtering apparatus while maintaining the temperature of the substrate at room temperature to 400° C. In the metal layer 19, the thicknesses of the Ni layer and the Au layer are smaller than the thickness of the ITO layer. Further, the ITO layer is preferably formed to a thickness of 300+600×N, where N is an integer. In this embodiment, the Ni layer and the Au layer are formed relatively thinly, that is, to thicknesses of 20 Å and 30 Å, respectively, and the ITO layer is formed relatively thickly, that is, to a thickness of 900 Å.

Figure 1E:
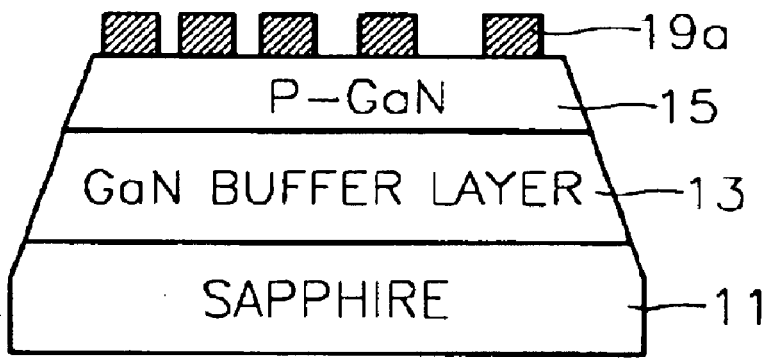

As shown in FIG. 1E, the photoresist pattern 17 and the metal layer 19 on the photoresist pattern 17 are removed by a lift-off process, thereby forming a metal layer pattern 19a. Subsequently, the metal layer pattern 19a is annealed at approximately 400 to 600° C. using rapid thermal annealing apparatus under oxygen or nitrogen atmosphere, thereby completing a p-type ohmic electrode. The contact resistance of the thus formed p-type ohmic electrode is calculated by a 4-point probe method.

Figure 2:
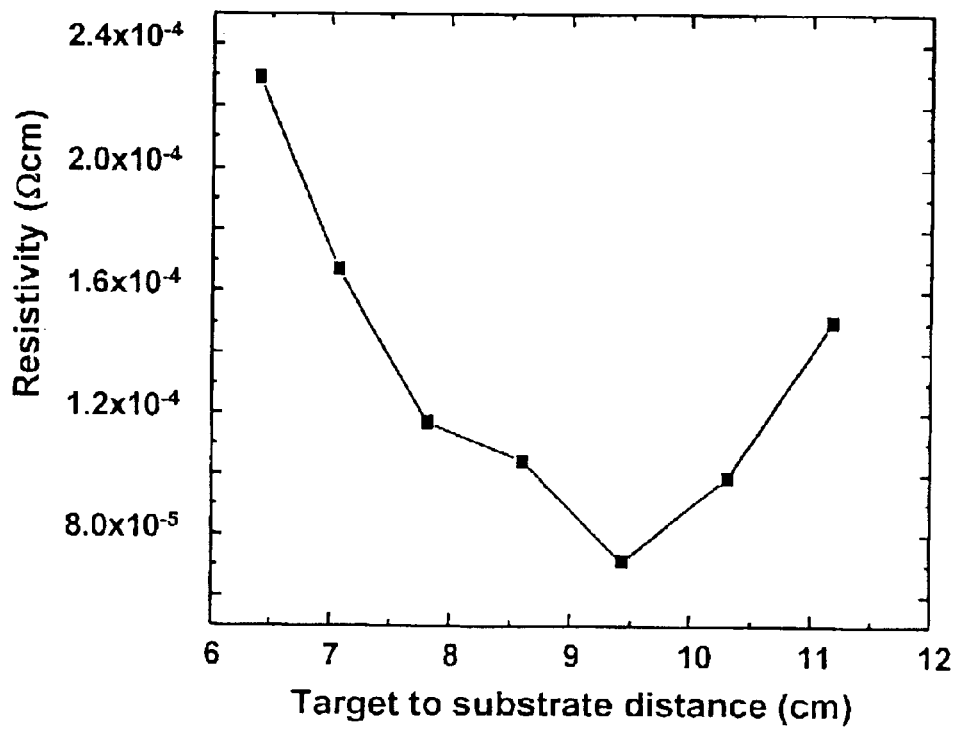
FIG. 2 is a graphical representation illustrating resistivity of an ITO layer employed in the p-type ohmic electrode of a GaN based optical device according to the present invention, depending on a target-to-substrate distance during deposition of the ITO layer.

FIG. 2 is a graphical representation illustrating resistivity of an ITO layer employed in the p-type ohmic electrode of a GaN based optical device according to the present invention, depending on a target-to-substrate distance during deposition of the ITO layer.

In detail, FIG. 2 shows the target-to-substrate distance corresponding to the lowest resistivity of the ITO layer. Referring to FIG. 2, when depositing the ITO layer, a 2-inch ITO layer containing $In_2O_3$ and $SnO_2$ mixed in a ratio of 9:1 is used as a target. Deposition is performed under conditions of deposition gas being argon, power being 200W, basic pressure being $10^{-6}$ Torr, processing pressure being 10 mtorr, substrate temperature maintained at 350° C., and a deposition apparatus being an RF magnetron sputter. When using the RF magnetron sputter, experimentation is performed according to distance between an ITO sputtered target and a substrate, considering the probability of damages to the substrate by plasma. When the target-to-substrate distance is 9.4 cm, the resistivity of the ITO layer is $7.1 \times 10^{-5}$ Ωcm. The resistivity is obtained by the 4-point probe method.

Figure 3:
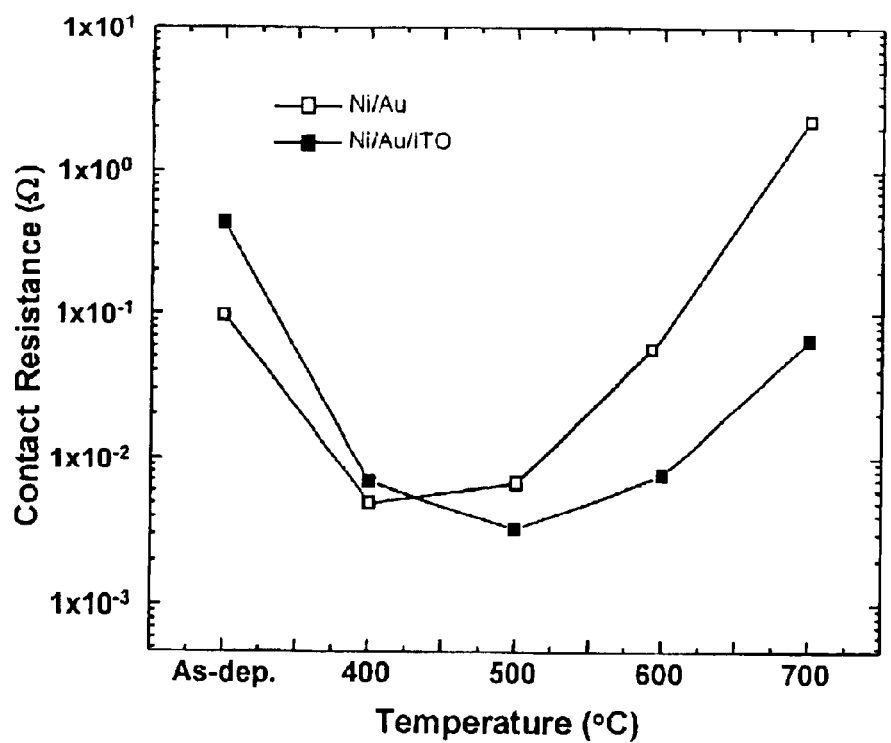
FIG. 3 is a graphical representation illustrating contact resistance depending on annealing temperature when the p-type ohmic electrode shown in FIG. 1 and a conventional p-type ohmic electrode are annealed under an oxygen atmosphere.

FIG. 3 is a graphical representation illustrating contact resistance depending on annealing temperature when the p-type ohmic electrode shown in FIG. 1 and a conventional p-type ohmic electrode are annealed under an oxygen atmosphere.

In detail, the p-type ohmic electrode according to the present invention is formed of a triple layer comprised of Ni/Au/ITO, as shown in FIG. 1, whereas the conventional p-type ohmic electrode is formed of Ni/Au, each having a thickness of 50 Å. Also, annealing is performed using a rapid thermal annealing apparatus under an oxygen atmosphere for 2 minutes, and contact resistance is calculated by the 4-point probe method.

As shown in FIG. 3, the p-type ohmic electrode according to the preset invention exhibited the lowest contact resistance, that is, $2.3 \times 10^{-3}$ Ω, when annealed at 500° C. In FIG. 3, "As-dep." Indicates an initial state before annealing.

Figure 4:
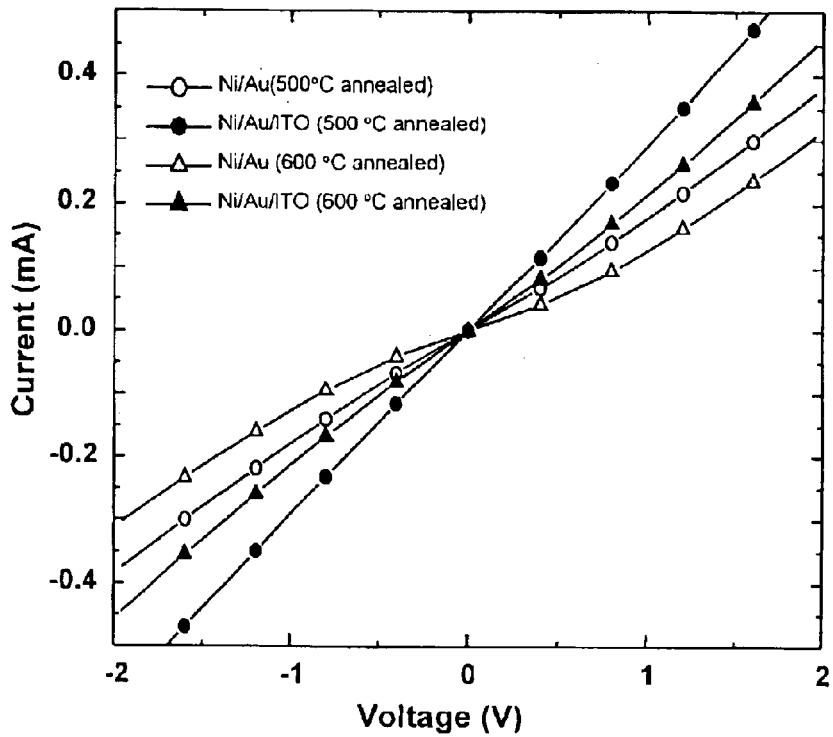
FIG. 4 is a graphical representation illustrating the current-voltage relationship depending on annealing temperature when the conventional p-type ohmic electrode formed of an Ni/Au layer and the p-type ohmic electrode according to the present invention are annealed under an oxygen atmosphere.

FIG. 4 is a graphical representation illustrating the current-voltage relationship depending on annealing temperature when the conventional p-type ohmic electrode formed of an Ni/Au layer and the p-type ohmic electrode according to the present invention are annealed under an oxygen atmosphere.

In detail, the p-type ohmic electrode according to the present invention is formed of a triple layer comprised of Ni/Au/ITO, as shown in FIG. 1, whereas the conventional p-type ohmic electrode is formed of a double layer comprised of Ni/Au. Here, the Ni layer and the Au layer are formed to a thickness of 50 Å, respectively. Also, the annealing is performed using rapid thermal annealing apparatus under an oxygen atmosphere at 500° C. and 600° C., respectively. As shown in FIG. 4, the p-type ohmic electrode formed of the Ni/Au/ITO layer has lower contact resistance than the conventional p-type ohmic electrode formed of the Ni/Au layer.

Figure 5:
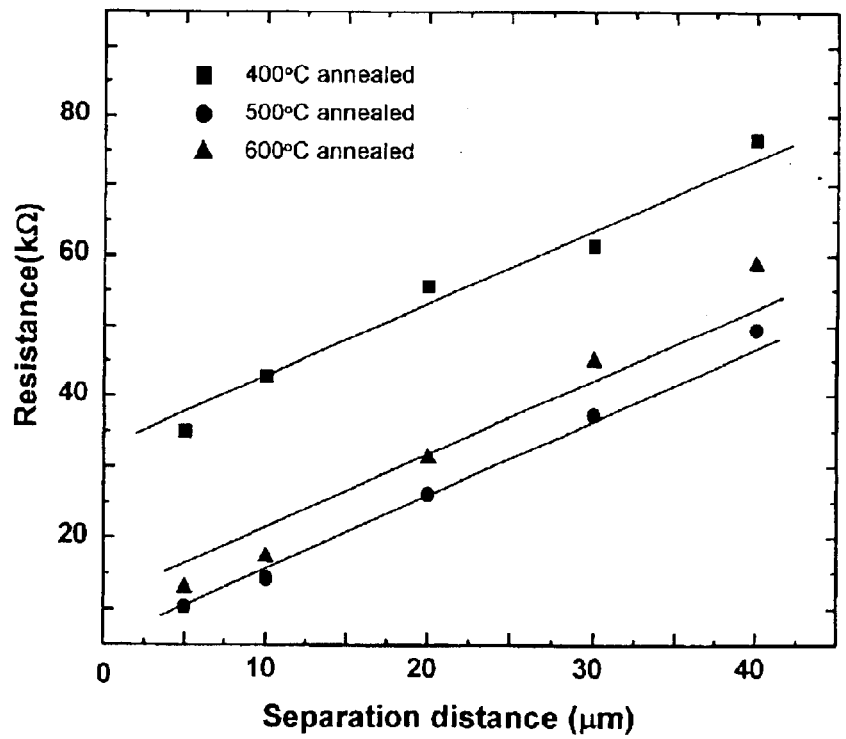
FIG. 5 is a graphical representation of resistance over a spacing (distance) between p-type ohmic electrode patterns when contact resistance is measured by a transmission line method (TLM)

FIG. 5 is a graphical representation of resistance over a spacing (distance) between p-type ohmic electrode patterns when contact resistance is measured by a transmission line method (TLM).

In detail, the p-type ohmic electrode according to the present invention is formed of a triple layer comprised of Ni/Au/ITO, as shown in FIG. 1. The annealing is performed using rapid thermal annealing apparatus under an oxygen atmosphere at 400° C., 500° C. and 600° C., respectively. Patterns of the p-type ohmic electrode are defined at intervals of 5, 10, 20, 30 and 40 mm. Resistance values measured from the patterns are substantially linearly distributed.

Figure 6:
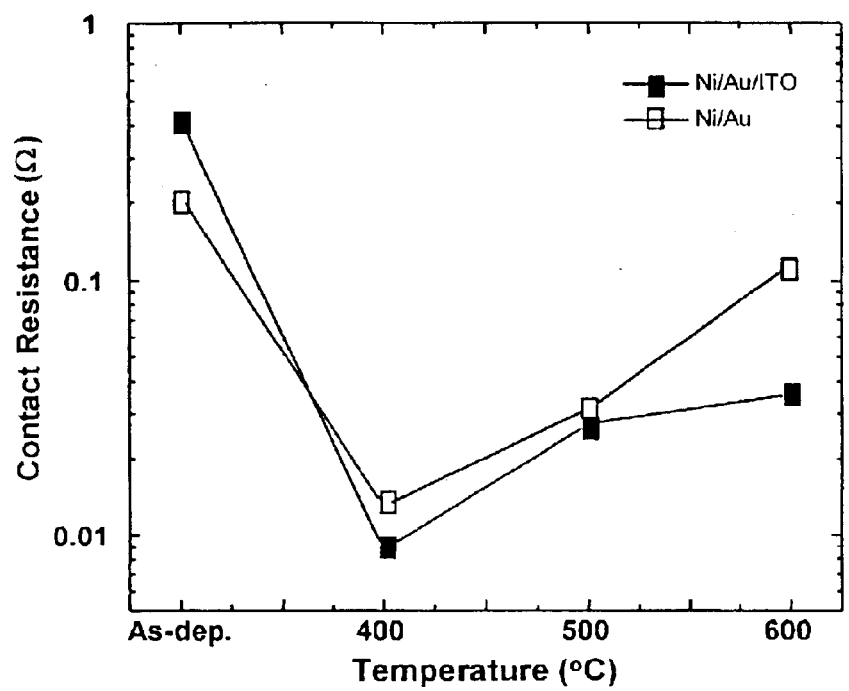
FIG. 6 is a graphical representation illustrating contact resistance depending on annealing temperature when the p-type ohmic electrode shown in FIG. 1 and the conventional p-type ohmic electrode are annealed under a nitrogen atmosphere.

FIG. 6 is a graphical representation illustrating contact resistance depending on annealing temperature when the p-type ohmic electrode shown in FIG. 1 and the conventional p-type ohmic electrode are annealed under a nitrogen atmosphere.

In detail, the p-type ohmic electrode according to the present invention is formed of a triple layer comprised of Ni/Au/ITO, as shown in FIG. 1, and the conventional p-type ohmic electrode is formed of a double layer comprised of Ni/Au. Here, the Ni layer and the Au layer are formed to a thickness of 50 Å, respectively. Also, the annealing is performed using rapid thermal annealing apparatus under a nitrogen atmosphere for 2 minutes. As shown in FIG. 6, when annealing is performed at 400° C., the p-type ohmic electrode formed of the Ni/Au/ITO layer has contact resistance of $8.8 \times 10^{-3}$ Ω, which is higher than that in the case where annealing is performed under an oxygen atmosphere and is lower than that of the conventional p-type ohmic electrode formed of the Ni/Au layer.

Figure 7:
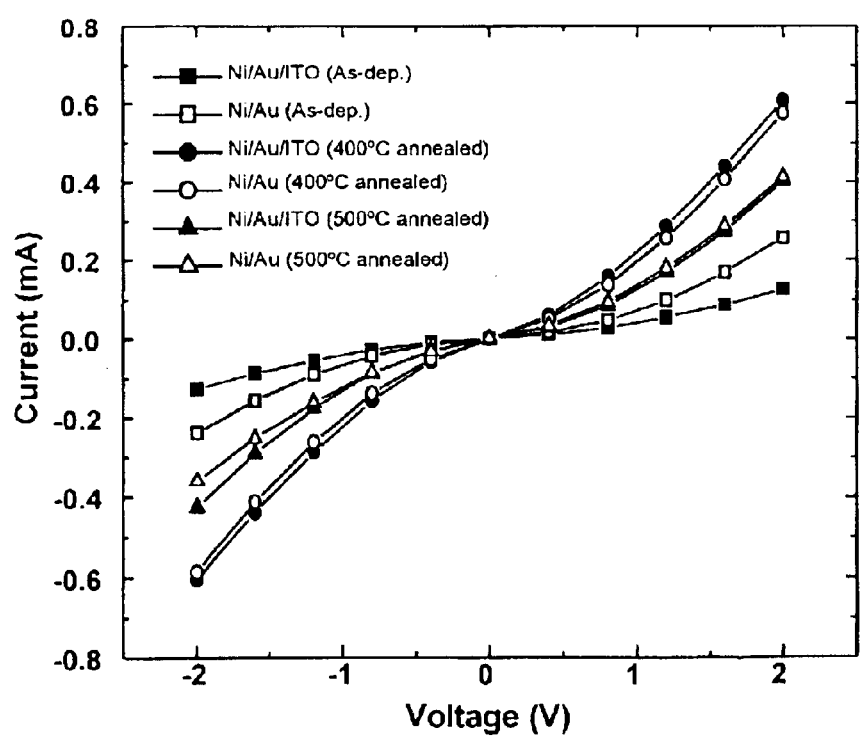
FIG. 7 is a graphical representation illustrating voltage-to-current characteristics depending on annealing temperature when the p-type ohmic electrode shown in FIG. 1 and the conventional p-type ohmic electrode are annealed under a nitrogen atmosphere.

FIG. 7 is a graphical representation illustrating voltage-to-current characteristics depending on annealing temperature when the p-type ohmic electrode shown in FIG. 1 and the conventional p-type ohmic electrode are annealed under a nitrogen atmosphere.

In detail, the p-type ohmic electrode according to the present invention is formed of a triple layer comprised of Ni/Au/ITO, as shown in FIG. 1, and the conventional p-type ohmic electrode is formed of a double layer comprised of Ni/Au. Here, the Ni layer and the Au layer are formed to a thickness of 50 Å, respectively. Also, the annealing is performed using rapid thermal annealing apparatus under a nitrogen atmosphere at 400° C. and 500° C., for 2 minutes, respectively. In FIG. 7, "As-dep." Indicates an initial state before annealing. The graphs shown in FIG. 7, in each of which current is plotted over voltage, are not linear graphs of perfect ohmic type. Also, it is understood that the p-type ohmic electrode formed of the Ni/Au/ITO layer has slightly lower contact resistance than the conventional p-type ohmic electrode formed of the Ni/Au layer although there is little difference in contact resistance.

Figure 8:
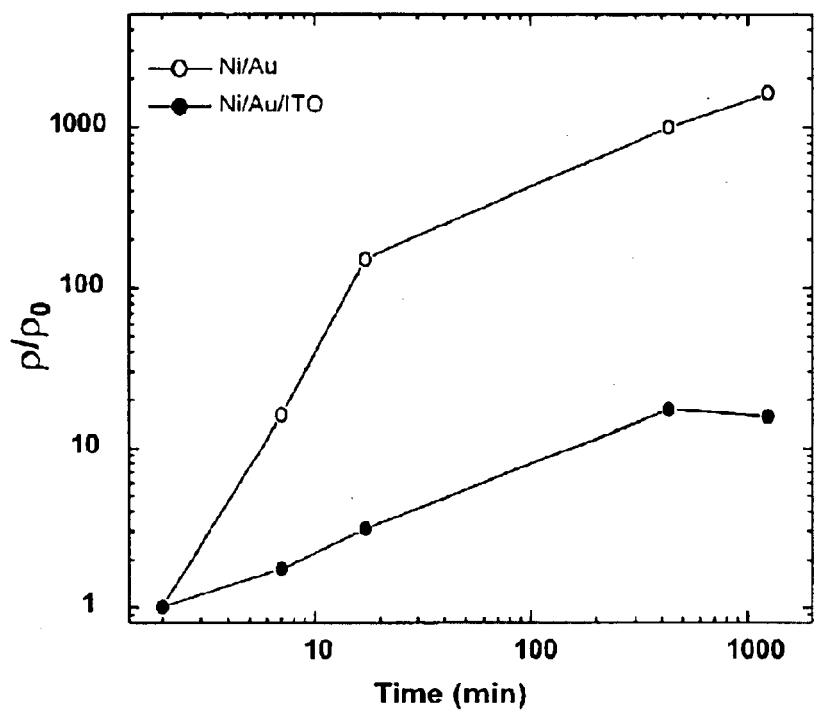
FIG. 8 is a graphical representation illustrating a change in contact resistance of the p-type ohmic electrode shown in FIG. 1 and the conventional p-type ohmic electrode, over time.

FIG. 8 is a graphical representation illustrating a change in contact resistance of the p-type ohmic electrode shown in FIG. 1 and the conventional p-type ohmic electrode, over time.

In detail, the p-type ohmic electrode according to the present invention is formed of a triple layer comprised of Ni/Au/ITO, as shown in FIG. 1, and the conventional p-type ohmic electrode is formed of a double layer comprised of Ni/Au. Here, the Ni layer and the Au layer are formed to a thickness of 50 Å, respectively. Thermal stability tests are performed on the p-type ohmic electrodes comprised of Ni/Au/ITO and Ni/Au, respectively. On the basis of the contact resistance ($\rho_0$) obtained by annealing at 500° C. for 1 minute, the contact resistance ($\rho$) is measured over time.

In the conventional p-type ohmic electrode comprised of Ni/Au, as the annealing time increases, the contact resistance increases in a 2~3 order. On the other hand, in the p-type ohmic electrode comprised of Ni/Au/ITO, the contact resistance increases in a 1~2 order over time. This is because, as the annealing time increases, oxygen in the ITO layer deposited on the Ni/Au layers is diffused more actively into the metal layer so that the Ni layer is converted into NiO which is a transparent, conductive oxide layer. Also, contact resistance of the ITO layer itself is reduced due to oxygen vacancy acting as a donor.

Figure 9:
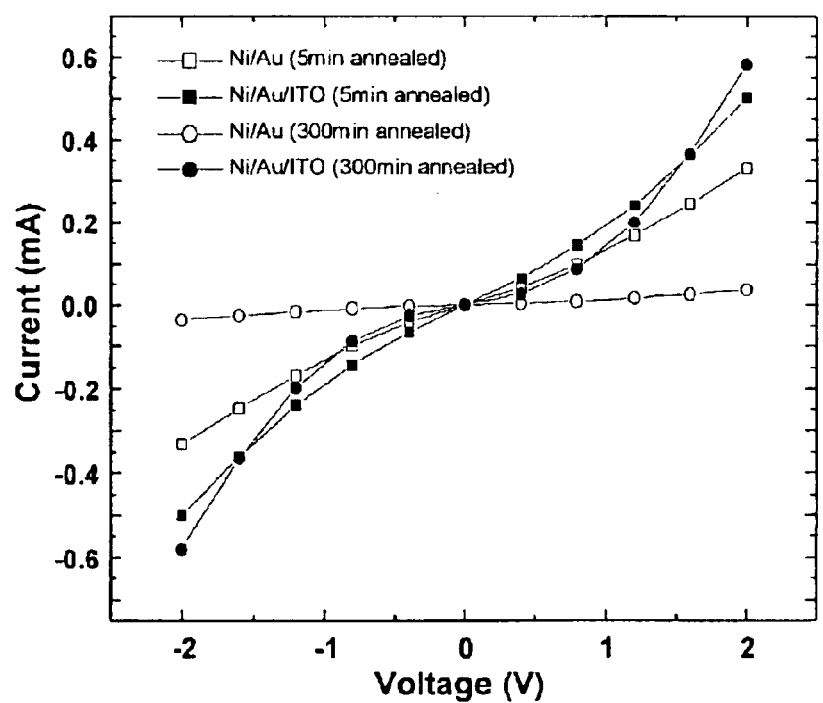
FIG. 9 is a graphical representations illustrating the current-voltage relationship depending on annealing time when the p-type ohmic electrode shown in FIG. 1 and the conventional a p-type ohmic electrode are annealed 500° C.

FIG. 9 is a graphical representations illustrating the current-voltage relationship depending on annealing time when the p-type ohmic electrode shown in FIG. 1 and the conventional a p-type ohmic electrode are annealed at 500° C.

In detail, the p-type ohmic electrode according to the present invention is formed of a triple layer comprised of Ni/Au/ITO, as shown in FIG. 1, and the conventional p-type ohmic electrode is formed of a double layer comprised of Ni/Au. Here, the Ni layer and the Au layer are formed to a thickness of 50 Å, respectively. Also, the annealing is performed using rapid thermal annealing apparatus at 500° C. for 5 minutes and 300 minutes. As shown in FIG. 9, the p-type ohmic electrode comprised of Ni/Au/ITO has lower contact resistance than that the conventional p-type ohmic electrode comprised of Ni/Au.

As described above, according to the present invention, when the p-type ohmic electrode in the GaN based optical device is formed of a triple layer comprised of Ni/Au/ITO, the Ni/Au layers reduce contact resistance and the ITO, which is a transparent, conductive oxide layer, increases transparency and increases luminescence efficiency. Further, the p-type ohmic electrode in the GaN based optical device according to the present invention having a triple layer, comprised of Ni/Au/ITO, exhibits thermal stability, which is confirmed by continuously performing annealing.

What is claimed is:

1. A gallium nitride (GaN) based optical device comprising:

a substrate;

a p-type GaN (p-GaN) layer formed on the substrate;

a nickel (Ni) layer and a gold (Au) layer sequentially formed on the p-GaN layer to reduce contact resistance; and an indium tin oxide (ITO) layer formed on the Au layer to increase transparency and luminescence efficiency, the thicknesses of the Ni layer and the Au layer are smaller than the thickness of the ITO layer, wherein a p-type ohmic electrode is formed of a triple layer comprising the Ni layer, the Au layer and the ITO layer.

2. A method of fabricating a gallium nitride (GaN) based optical device comprising:

forming a p-type GaN (p-GaN) layer on a substrate;

sequentially forming a nickel (Ni) layer and a gold (Au) layer on the p-GaN layer to reduce contact resistance;

forming an indium tin oxide (ITO) layer on the Au layer to increase transparency and luminescence efficiency, the thicknesses of the Ni layer and the Au layer are smaller than the thickness of the ITO layer; and annealing a metal layer comprising the Ni layer, the Au layer and the ITO layer to form a p-type ohmic electrode.

3. The method of claim 2, wherein the annealing of the metal layer is performed under an oxygen or nitrogen atmosphere.

4. The method of claim 2, wherein the annealing of the metal layer is performed at 400~600° C.

5. The method of claim 2, wherein the ITO layer is formed using an RF magnetron sputtering apparatus while maintaining the temperature of the substrate at room temperature to 400° C.

* * * * *